(12) United States Patent
Li et al.

(10) Patent No.: US 7,786,807 B1
(45) Date of Patent: Aug. 31, 2010

(54) CASCODE CMOS RF POWER AMPLIFIER WITH PROGRAMMABLE FEEDBACK CASCODE BIAS UNDER MULTIPLE SUPPLY VOLTAGES

(75) Inventors: Mingyuan Li, San Diego, CA (US); Ali Afsahi, San Diego, CA (US); Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/428,616

(22) Filed: Apr. 23, 2009

(51) Int. Cl.
 *H03F 3/04* (2006.01)
(52) U.S. Cl. ........................ 330/311; 330/290
(58) Field of Classification Search ......... 330/310–311, 330/297–298, 207 P, 277, 290
See application file for complete search history.

(56) References Cited

U.S. PATENT DOCUMENTS 4,900,955 A * 2/1990 Kurpan ..................... 327/306
6,137,367 A * 10/2000 Ezzedine et al. ............ 330/311
7,248,120 B2 * 7/2007 Burgener et al. ............ 330/311

* cited by examiner

*Primary Examiner*—Robert Pascal
*Assistant Examiner*—Hieu P Nguyen
(74) *Attorney, Agent, or Firm*—Garlick Harrison & Markison; Bruce E. Garlick

(57) ABSTRACT

A Radio Frequency (RF) cascode power amplifier operates with differing battery supply voltages. A transconductance stage has a transistor with an RF signal input at its gate. A cascode stage has at least one cascode transistor, the cascode stage coupled in series with the transconductance stage between a battery voltage node and ground, the cascode stage having an RF signal output at the battery voltage node and at least one bias input to the at least one cascode transistor. Cascode bias feedback circuitry applies fixed bias voltage(s) to the at least one two bias inputs for a low battery voltage and applies feedback bias voltage(s) to the at least two bias inputs for a high battery voltage, the feedback bias voltage(s) based upon a voltage of the battery voltage node. More than two differing battery supply voltages are supported.

19 Claims, 8 Drawing Sheets

CASCODE CMOS RF POWER AMPLIFIER WITH PROGRAMMABLE FEEDBACK CASCODE BIAS UNDER MULTIPLE SUPPLY VOLTAGES

BACKGROUND

1. Technical Field

This invention relates generally to wireless communication systems and more particularly to Radio Frequency power amplifiers used in transmitters of wireless devices within such communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11x, Bluetooth, wireless wide area networks (e.g., WiMAX), advanced mobile phone services (AMPS), digital AMPS, global system for mobile communications (GSM), North American code division multiple access (CDMA), Wideband CDMA, local multi-point distribution systems (LMDS), multi-channel-multi-point distribution systems (MMDS), radio frequency identification (RFID), Enhanced Data rates for GSM Evolution (EDGE), General Packet Radio Service (GPRS), and many others.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations, and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard. As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Most, if not all wireless communication standards limit transmitted power level. Further, some wireless communication standards include reverse link power control, which allows a remote device to control transmit power of another wireless device, e.g., base station controls reverse link transmit power of hand held devices. Thus, in most if not all wireless devices, the power amplifier is actively controlled to thereby control transmit power. Shortcomings exist with respect to the efficiency of the power amplifier. When the power amplifier is matched well with the antenna, efficient transmission results. However, if mismatch is present, inefficiency results. Such inefficiency results in excess power drain (by the power amplifier) as well as reduction in transmit power. This mismatch can occur due to operational variations of the antenna, e.g., alteration of input impedance due to antenna configuration/position, as well as operational variations of the power amplifier and other RF signal path components of the wireless device due to temperature fluctuations, voltage supply variations, etc. In wireless communication devices, the power amplifier is often required to provide a high swing at its output. The power amplifier must also be very linear in its operation and also use as little power as possible. These competing goals are very difficult to meet, particularly in portable devices that are battery powered and that operate at relatively low voltages.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE DRAWINGS

Figure 1:
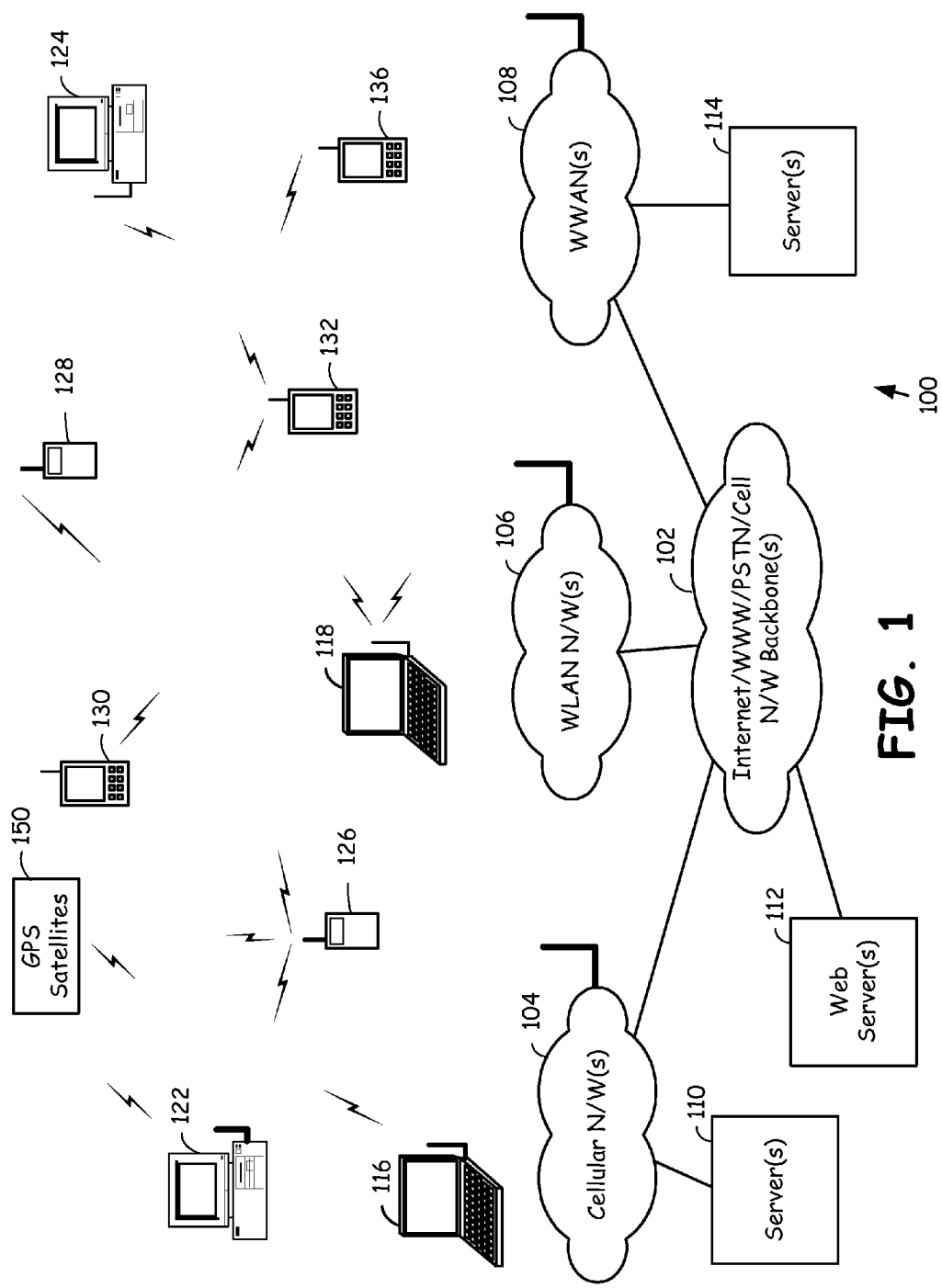
FIG. 1 is a system diagram illustrating a wireless communication system constructed and operating according to one or more embodiments of the present invention.

FIG. 1 is a system diagram illustrating a wireless communication system constructed and operating according to one or more embodiments of the present invention. The wireless communication system 100 of FIG. 1 includes a communication infrastructure and a plurality of wireless devices. The communication infrastructure includes one or more cellular networks 104, one or more wireless local area networks (WLANs) 106, and one or more wireless wide area networks (WWANs) 108. The cellular networks 104, WLANs 106, WWANs 108 all typically couple to one or more backbone networks. The backbone networks 102 may include the Internet, the Worldwide Web, one or more public switched telephone network backbones, one or more cellular network backbones, one or more private network backbones and/or other types of backbones that support communications with the various wireless network infrastructures 104, 106, and 108. Server computers may couple to these various network infrastructures. For example, server computer 110 couples to cellular network 104, web server 112 couples to the Internet/WWW/PSTN/Cell network 102, and server 114 couples to WWAN network 108. Other devices may couple to these networks as well in various other constructs.

Each of the cellular networks 104, WLANs 106, and WWANs 108 support wireless communications with wireless devices in various wireless spectra and according to various communication protocol standards. For example, the cellular network 104 may support wireless communications with wireless devices within the 800 MHz band and the 1900 MHz band, and/or other Radio Frequency (RF) bands that are allocated for cellular network communications. The cellular network 104 may support GSM, EDGE, GPRS, 3G, CDMA, TDMA, and/or various other standardized communications. Of course, these are examples only and should not be considered to limit the spectra or operations used by such cellular networks. The WLANs 106 typically operate within the Industrial, Scientific, and Medical (ISM) bands that include the 2.4 GHz and 5.8 GHz bands. The ISM bands include other frequencies as well that support other types of wireless communications, such bands including the 6.78 MHz, 13.56 MHz, 27.12 MHz, 40.68 MHz, 433.92 MHz, 915 MHz, 24.125 GHz, 61.25 GHz, 122.5 GHz, and 245 GHz bands. The WWANs networks 108 may operate within differing RF spectra based upon that which is allocated at any particular locale. Device to device communications may be serviced in one of these frequency bands as well.

The wireless network infrastructures 104, 106, and 108 support communications to and from wireless devices 116, 118, 122, 124, 126, 128, 130, 132, and/or 136. Various types of wireless devices are illustrated. These wireless devices include laptop computers 116 and 118, desktop computers 122 and 124, cellular telephones 126 and 128, portable beta terminals 130, 132, and 136. Of course, differing types of devices may be considered wireless devices within the context of the scope of the present invention. For example, automobiles themselves having cellular interfaces would be considered wireless devices according to the present invention. Further, any device having a wireless communications interface either bi-directional or uni-directional, may be considered a wireless device according to the present invention, in various other types of wireless devices. For example, wireless devices may include Global Positioning System (GPS) receiving capability to receive positioning signals from multiple GPS satellites 150.

The wireless devices 116-136 may support peer-to-peer communications as well, such peer-to-peer communications not requiring the support of a wireless network infrastructure. For example, these devices may communicate with each other in a 60 GHz spectrum, may use a peer-to-peer communications within a WLAN spectrum, for example, or may use other types of peer-to-peer communications. For example, within the ISM spectra, wireless devices may communicate according to Bluetooth protocol or any of the various available WLAN protocols supported by IEEE802.11x, for example.

As will be further described with reference to FIGS. 2-8, each of the wireless devices 116-136 illustrated in FIG. 1 includes baseband processing circuitry, Radio Frequency (RF) transceiver, and at least one antenna. According to the present invention, the RF transceiver includes an RF power amplifier constructed and operating according to the present invention. The RF power amplifiers of these devices are power efficient and able to operate at multiple battery voltages without requiring a voltage regulator.

Figure 2:
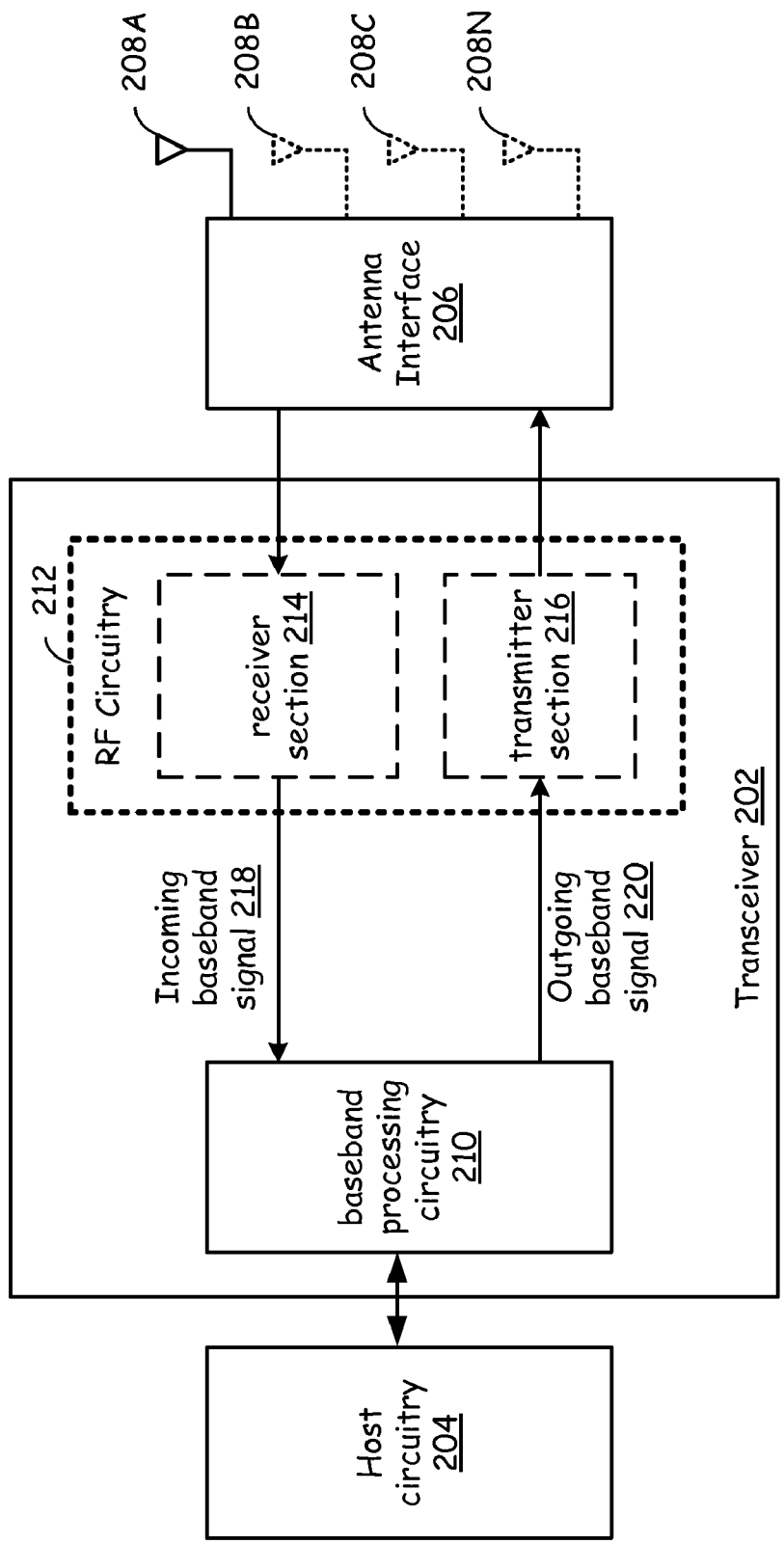
FIG. 2 is a block diagram illustrating components of a wireless device constructed and operating according to the present invention.

FIG. 2 is a block diagram illustrating components of a wireless device constructed and operating according to the present invention. The wireless device includes host circuitry 204, RF transceiver 202, antenna interface 206, and a plurality of antenna elements 208A, 208B, 208C, and 208N. In some embodiments of the wireless device of FIG. 2, the antenna may include only a single antenna element. However, as shown, in FIG. 2 the antenna may have a plurality of antenna elements 208A-208N which are configurable by the antenna interface 206. Configurability via antenna interface 206 may include operation with directionality, MIMO, or other multiple antenna configurations.

Host circuitry 204 may include processing circuitry, memory, user interfaces, wired interfaces, and/or other circuitry associated with the wireless device. For example, wireless devices typically have a display, a keyboard, and/or multiple other user interface devices. Further, the wireless device includes one or more batteries for powering the wireless device. The RF transceiver 202 includes baseband processing circuitry 210 and RF circuitry 212. The baseband processing circuitry 210 produces an outgoing baseband signal 220 to a transmitter section 216 of the RF circuitry 212. Receiver section 214 of the RF circuitry 212 produces an incoming baseband signal 218 to the baseband processing circuitry 210. RF circuitry 212 produces an outgoing RF signal from transmitter section 216 to antenna interface 206. The antenna interface 206 couples the outgoing RF signal to one or more of the plurality of antenna elements 208A-208N. Receiver section 214 of RF circuitry 212 receives an incoming RF signal from antenna interface 206 and converts the incoming RF signal to the incoming baseband signal 218. Likewise, the transmitter section 216 converts the outgoing baseband signal 220 to the outgoing RF signal which the transmitter section 216 produces to antenna interface 206.

According to the present invention, the transmitter section includes at least one RF power amplifier that can operate at multiple battery voltages. The RF power amplifier has a cascode structure in some embodiments and has cascode bias feedback circuitry that provides at least one bias voltage to a cascode stage of the amplifier. Various embodiments according to the present invention will be described further herein with reference to FIGS. 3-8.

Figure 3:
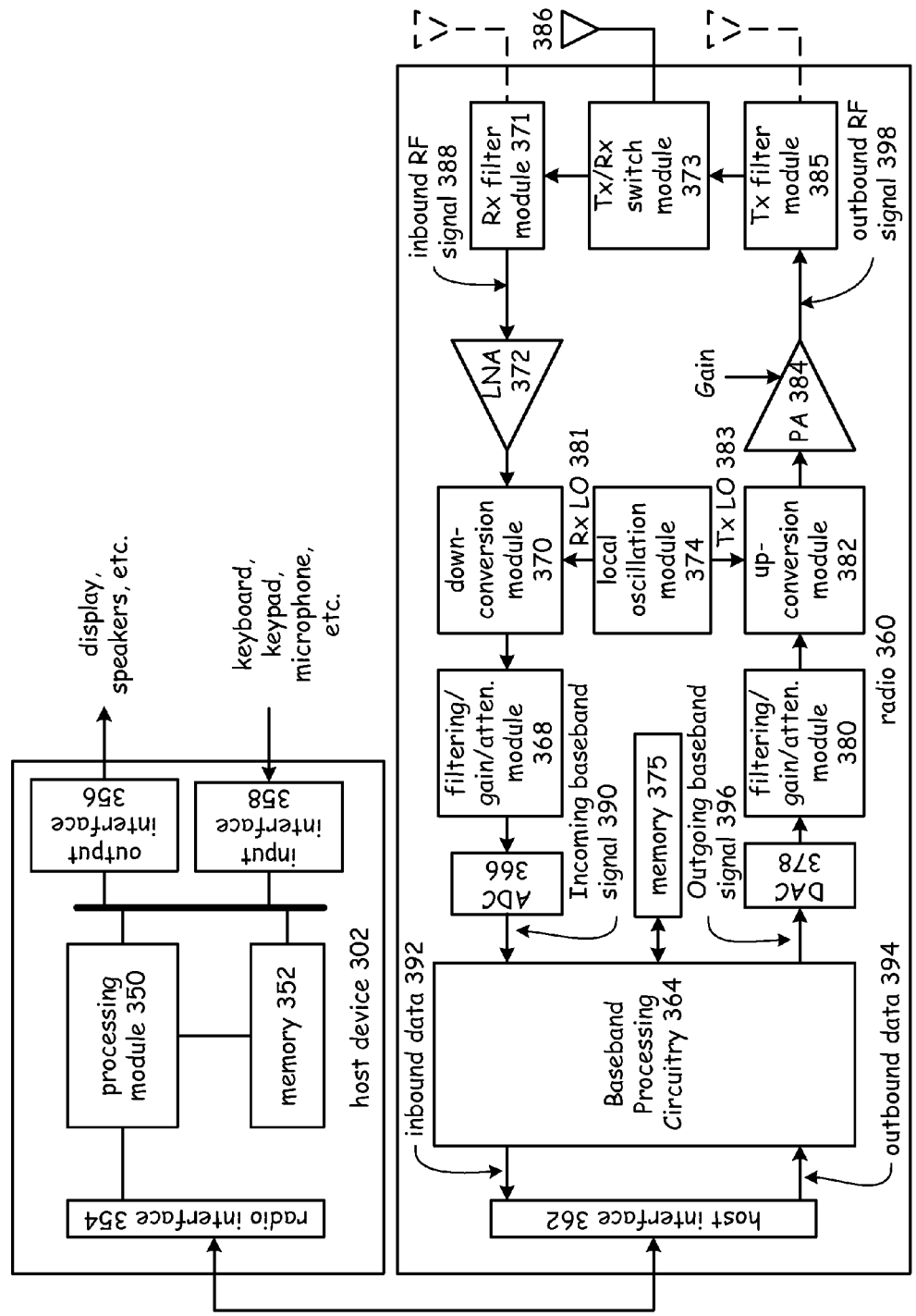
FIG. 3 is a schematic block diagram illustrating a wireless communication device that includes a host device and an associated radio.

FIG. 3 is a schematic block diagram illustrating a wireless communication device that includes a host device and an associated radio. For cellular telephone hosts, the radio 360 is a built-in component. For personal digital assistants hosts, laptop hosts, and/or personal computer hosts, the radio 360 may be built-in or may be an externally coupled component that couples to the host device 302 via a communication link, e.g., PCI interface, PCMCIA interface, USB interface, or another type of interface.

As illustrated, the host device 302 includes a processing module 350, memory 352, radio interface 354, input interface 358, and output interface 356. The processing module 350 and memory 352 execute the corresponding instructions that are typically done by the host device. For example, for a cellular telephone host device, the processing module 350 performs the corresponding communication functions in accordance with a particular cellular telephone standard.

The radio interface 354 allows data to be received from and sent to the radio 360. For data received from the radio 360 (e.g., inbound data), the radio interface 354 provides the data to the processing module 350 for further processing and/or routing to the output interface 356. The output interface 356 provides connectivity to an output display device such as a display, monitor, speakers, et cetera, such that the received data may be displayed. The radio interface 354 also provides data from the processing module 350 to the radio 360. The processing module 350 may receive the outbound data from an input device such as a keyboard, keypad, microphone, et cetera via the input interface 358 or generate the data itself. For data received via the input interface 358, the processing module 350 may perform a corresponding host function on the data and/or route it to the radio 360 via the radio interface 354.

Radio 360 includes a host interface 362, baseband processing circuitry/baseband processing module 364, an analog-to-digital converter (ADC) 366, a filtering/gain/attenuation module 368, an IF mixing down conversion stage 370, a receiver filter 371, a low noise amplifier (LNA) 372, a transmitter/receiver switch 373, a local oscillation module 374, memory 375, a digital-to-analog converter (DAC) 378, a filtering/gain/attenuation module 380, an IF mixing up conversion stage 382, a power amplifier (PA) 384, a transmitter filter module 385, and one or more antennas 386. The antenna 386 may be a single antenna that is shared by the transmit and receive paths as regulated by the Tx/Rx switch 373, or may include separate antennas for the transmit path and receive path. The antenna implementation will depend on the particular standard to which the wireless communication device is compliant and the particular design of the device.

The baseband processing circuitry 364, in combination with operational instructions stored in memory 375, executes digital receiver functions and digital transmitter functions. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The baseband processing circuitry 364 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 375 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing circuitry 364 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 375 stores, and the baseband processing circuitry 364 executes, operational instructions that facilitate functionality of the device.

In operation, the radio 360 receives outbound data 394 from the host device via the host interface 362. The host interface 362 routes the outbound data 394 to the baseband processing circuitry 364, which processes the outbound data 394 in accordance with a particular wireless communication standard (e.g., Cellular, WiMAX, IEEE802.11a, IEEE802.11b, IEEE802.11g, IEEE802.11n, Bluetooth, et cetera) to produce digital transmission formatted data/outgoing baseband signal 396. The digital transmission formatted data 396 will be a digital base-band signal or a digital low IF signal, where the low IF typically will be in the frequency range of one hundred kilohertz to a few megahertz.

The digital-to-analog converter 378 converts the digital transmission formatted data 396 from the digital domain to the analog domain. The filtering/gain/attenuation module 380 filters and/or adjusts the gain of the analog signal prior to providing it to the IF mixing stage 382. The IF mixing stage 382 directly or via multiple conversion steps (super heterodyne) converts the analog baseband or low IF signal into an RF signal based on a transmitter local oscillation 383 provided by local oscillation module 374. The power amplifier (PA) 384 amplifies the RF signal to produce outbound RF signal 398, which is filtered by the transmitter filter module 385. The antenna 386 transmits the outbound RF signal 398 to a targeted device such as a base station, an access point, and/or another wireless communication device.

The radio 360 also receives an inbound RF signal 388 via the antenna 386, which was transmitted by a base station, an access point, or another wireless communication device. The antenna 386 provides the inbound RF signal 388 to the receiver filter module 371 via the Tx/Rx switch 373, where the Rx filter 371 band pass filters the inbound RF signal 388. The Rx filter 371 provides the filtered RF signal to low noise amplifier (LNA) 372, which amplifies the signal 388 to produce an amplified inbound RF signal. The low noise amplifier 372 provides the amplified inbound RF signal to the IF mixing module 370, which directly converts the amplified inbound RF signal into an inbound low IF signal or baseband signal based on a receiver local oscillation 381 provided by local oscillation module 374. The down conversion module 370 provides the inbound low IF signal or baseband signal to the filtering/gain/attenuation module 368. The filtering/gain/attenuation module 368 may be implemented in accordance with the teachings of the present invention to filter and/or attenuate the inbound low IF signal or the inbound baseband signal to produce a filtered inbound signal.

The analog-to-digital converter 366 converts the filtered inbound signal from the analog domain to the digital domain to produce digital reception formatted data/incoming baseband signal 390. The baseband processing circuitry 364 decodes, descrambles, demaps, and/or demodulates the digital reception formatted data 390 to recapture inbound data 392 in accordance with the particular wireless communication standard being implemented by radio 360. The host interface 362 provides the recaptured inbound data 392 to the host device 18-32 via the radio interface 354.

As one of average skill in the art will appreciate, the wireless communication device of FIG. 3 may be implemented using one or more integrated circuits. For example, the host device may be implemented on one integrated circuit, the baseband processing circuitry 364, and memory 375 may be implemented on a second integrated circuit, and the remaining components of the radio 360, less the antenna(s) 386, may be implemented on a third integrated circuit. As an alternate example, the radio 360 may be implemented on a single integrated circuit. As yet another example, the processing module 350 of the host device and the baseband processing circuitry 364 may be a common processing device implemented on a single integrated circuit. Further, the memory 352 and memory 375 may be implemented on a single integrated circuit and/or on the same integrated circuit as the common processing modules of processing module 350 and the baseband processing circuitry 364.

According to various aspects of the present invention, the PA 384 (RF power amplifier) is operable with multiple supply voltages, without requiring a voltage regulator for power. Various embodiments of the RF power amplifier will be described further herein with reference to FIGS. 4-8.

Figure 4:
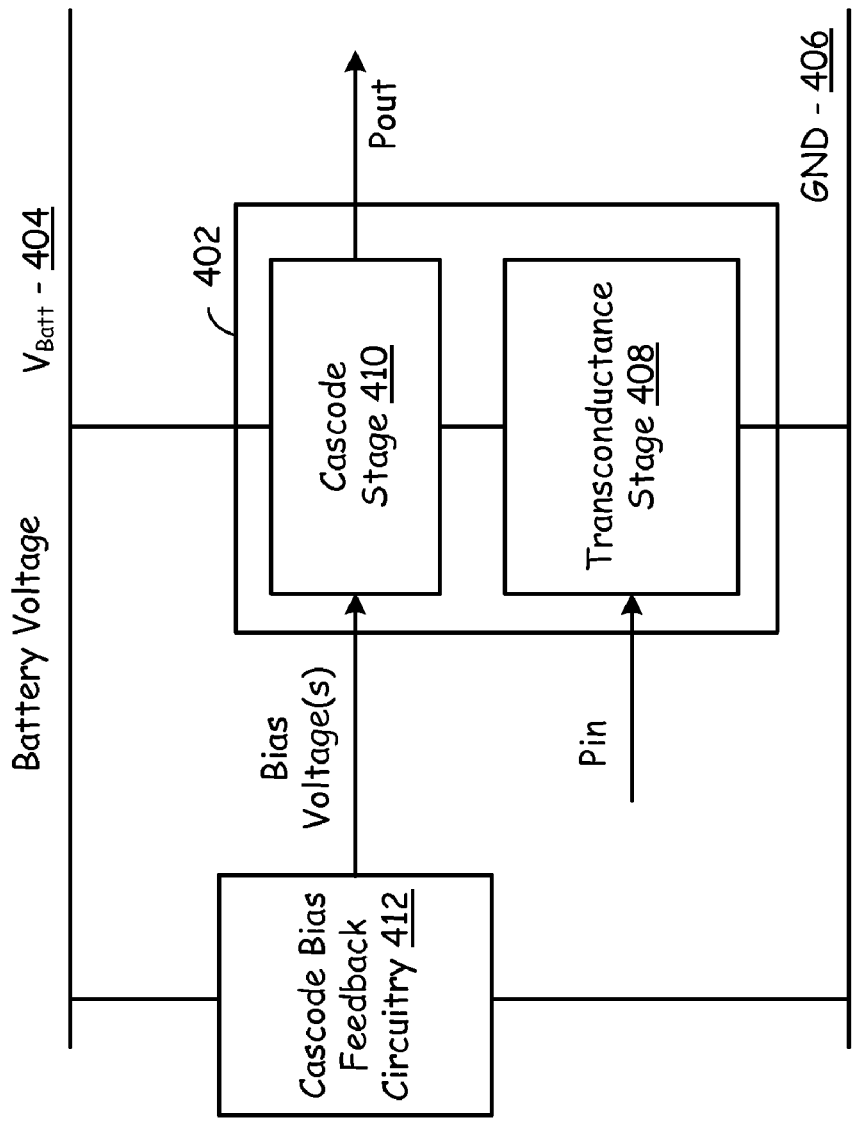
FIG. 4 is a block diagram illustrating a Radio Frequency (RF) cascode power amplifier constructed according to one or more embodiments of the present invention.

FIG. 4 is a block diagram illustrating an RF power amplifier constructed according to one or more embodiments of the present invention. The RF power amplifier includes an amplifier portion 402 having a transconductance stage 408 and a cascade stage 410. The transconductance stage 408 has a transconductance device with an RF signal input operable to receive the RF input signal $P_{in}$. The cascade stage 410 has at least one cascode transistor and is coupled in series with the transconductance stage 408 between a battery voltage node 404 and ground 406. The cascade stage 410 has an RF signal output that produces the signal $P_{out}$. Further, the cascade stage 410 has at least one bias input that is applied to a gate of the at least one cascode transistor. As illustrated in FIG. 4, the at least one bias input receives one or more bias voltages, the number of which depends upon the number of cascode transistors included in the cascade stage 410.

The RF power amplifier of FIG. 4 further includes cascode bias feedback circuitry 412. The cascode feedback bias circuitry 412 couples between the battery voltage node 404 and ground 406. In its operations, which will be described further herein with reference to FIGS. 5-8, the cascode bias feedback circuitry 412 applies a fixed bias voltage or voltages to the at least one bias input for at least one relatively lower battery voltage and applies at least one feedback bias voltage to the at least one bias input of the cascade stage 410 for at least one relatively higher battery voltage. The battery voltage upon which cascode bias feedback circuitry 412 determines and sets the bias voltage(s) is represented by $V_{Batt}$ present at the battery voltage node 404. As will be further illustrated with reference to FIGS. 5-8, the feedback bias voltage(s) is/are based upon the voltage at the battery voltage node 404, which also serves as the signal output node to produce signal $P_{out}$.

In its various operations, the cascode bias feedback circuitry 412 is operable to select one of the fixed bias voltage(s) or a feedback bias voltage(s) based upon a DC voltage at the battery voltage node 404. In one particular embodiment or embodiments of the present invention, the RF power amplifier of the present invention supports battery voltages of 2.5 volts, 3.3 volts, 4.3 volts, and 5.5 volts. Based upon which one of these battery voltages is present at the battery voltage node at a particular point and time, the cascode bias feedback circuitry 414 selects either/or the feedback bias voltage or the fixed bias voltage for application at bias input(s) to the cascode stage 410. Further, based upon the battery supply voltage level, the value of the fixed bias voltage and/or the feedback bias voltage may differ.

Figure 5:
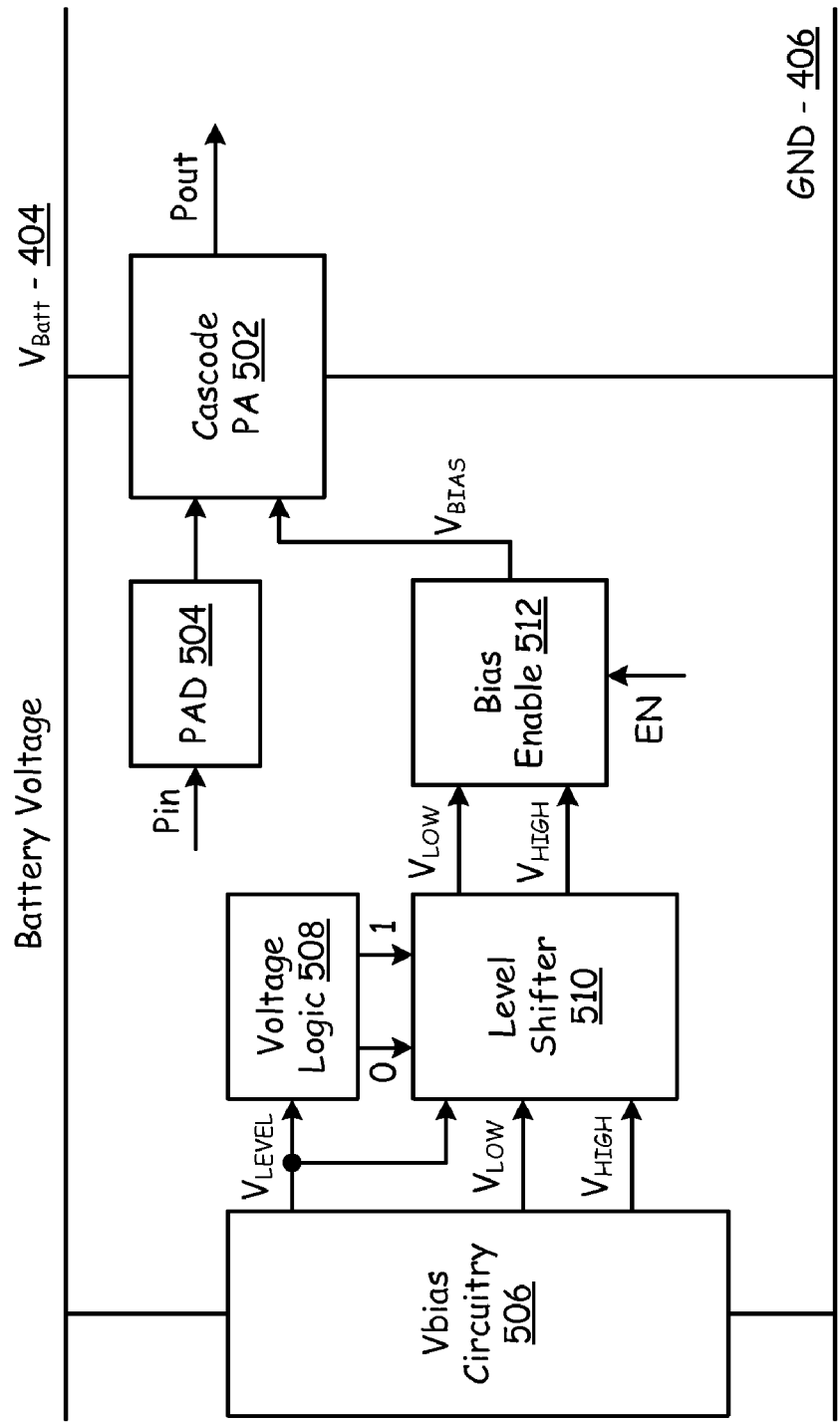
FIG. 5 is a block diagram illustrating another embodiment of an RF power amplifier constructed according to one or more embodiments of the present invention.

FIG. 5 is a block diagram illustrating another embodiment of an RF power amplifier constructed according to one or more embodiments of the present invention. As contrasted to the structure of FIG. 4, the structure illustrated in FIG. 5 has less detail for the cascode power amplifier 502 and more detail for embodiments of cascode bias feedback circuitry according to one particular structure. Both the cascode PA 502 and the $V_{BIAS}$ circuitry 506 couple between battery voltage node 404 and ground 406. The cascode PA 502 receives its input from a power amplifier driver (PAD) 504 that receives the input voltage signal $P_{IN}$. Cascode PA 502 produces an amplified RF output signal $P_{out}$. $V_{BIAS}$ circuitry 506 determines a voltage level ($V_{LEVEL}$) of the battery voltage node 404. The $V_{BIAS}$ circuitry 506 further produces $V_{LOW}$ and $V_{HIGH}$ levels to a level shifter 510. $V_{LEVEL}$ signal is provided to voltage logic 508 by $V_{BIAS}$ circuitry 506, which produces a logical output of either 0 or 1 to the level shifter 510. The level shifter 510 produces both $V_{LOW}$ and $V_{HIGH}$ output signals to bias enable circuitry 512. The bias enable circuitry 512 also receives an enable signal and produces one or more $V_{BIAS}$ signals to cascode PA 502. These $V_{BIAS}$ signals are provided to one or more gates of cascade transistors of the cascade PA 502.

Operation of the structure of FIG. 5 will be described further herein with reference to FIG. 8. A particular example of structure of FIG. 5 is further described herein with reference to FIG. 6. A differential construction of an RF power amplifier constructed according to one or more embodiments to the present invention is illustrated in FIG. 7.

Figure 6:
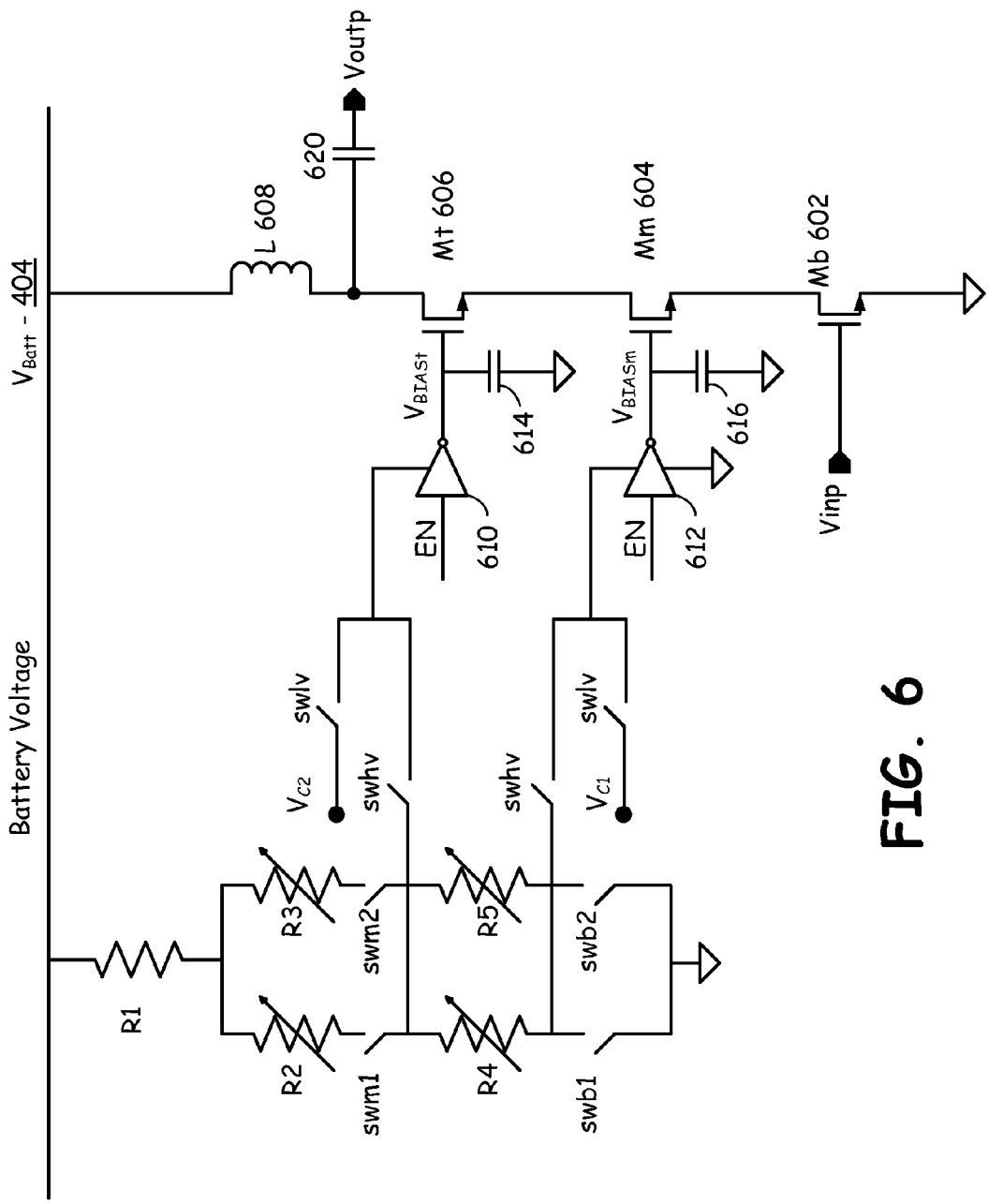
FIG. 6 is a circuit diagram illustrating a portion of an RF power amplifier constructed according to one or more embodiments of the present invention.
Figure 7:
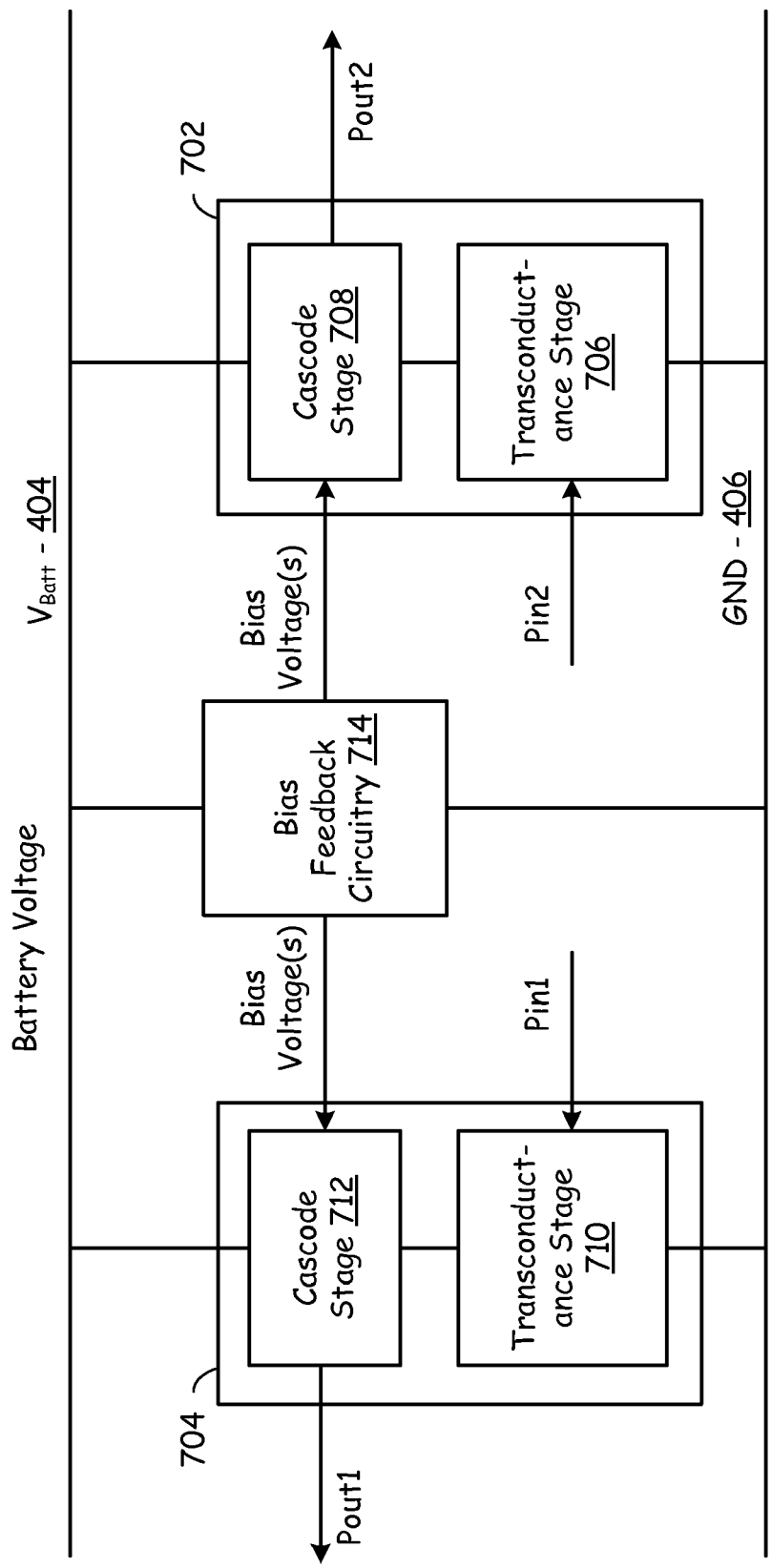
FIG. 7 is a block diagram illustrating a differential embodiment of an RF power amplifier constructed according to one or more embodiments of the present invention.

FIG. 6 is a circuit diagram illustrating a portion of an RF power amplifier constructed according to one or more embodiments of the present invention. The RF power amplifier includes a transconductance stage, a cascade stage, and cascade bias feedback circuitry. The transconductance stage has a transistor Mb 602 (having smaller features sizes, including a thin gate device in the embodiment) and receives a RF signal input at its gate. The cascode stage includes two cascode transistors Mt 606 and Mm 604 (both having larger features sizes, including thick gate devices, in the embodiment). The cascode amplifier produces signal output signal $V_{outp}$. Choke inductor 608 serves to block signal flow to battery voltage node 404 and capacitor 620 serves to block DC components of the signal $V_{outp}$. In other embodiments, AC blocking elements (inductors) and DC blocking elements (capacitors) may be configured differently for the RF power amplifier. Further, an output balun (balanced/unbalanced transformer) may serve to couple differential RF signal output to an antenna.

Cascode transistors Mm 604 and Mt 606 of the cascode stage each include bias inputs at their respective gate. The cascode feedback circuitry provides either fixed bias voltages or feedback bias voltages to the gates of the transistor 604 and 606. The cascode bias feedback circuitry includes a switched network coupled between the battery voltage node 404 and ground. Switch network includes a plurality of lumped circuit elements R1, R2, R3, R4, and R5 and a plurality of switches swm1, swm2, swb1, and swb2. The cascode bias feedback circuitry also includes fixed bias voltage nodes $V_{C1}$ and $V_{C2}$, which receive the respective fixed bias voltages from other circuitry (not illustrated). For relatively higher battery voltages, switches swhv are closed and at least some of switches swm1, swm2, swb1, and swb2 are closed. Note that at least some of the plurality of lumped circuit elements of the switched network of the cascode bias feedback circuitry may be variable resistors.

The switch positions and resistor values of the cascode bias feedback circuitry are selected based upon the particular implementation of the RF power amplifier and the voltage supply level at battery voltage node 404. For example, in one particular embodiment, the RF power amplifier supports battery voltage supply levels of 2.5V, 3.3V, 4.3V, and 5.5 volts. At the two lower battery supply voltage levels, 2.5V and 3.3V, fixed bias voltages, $V_{C1}$ and $V_{C2}$ are applied to gates of cascode transistors Mm 604 and Mt 606, respectively (switches swlv closed and switches swhw open). These fixed bias voltages $V_{C1}$ and $V_{C2}$ may differ for the differing battery supply voltages of 2.5V and 3.3V. At the two higher battery supply voltage levels, 4.3V and 5.5V, feedback bias voltages are applied to the gates of cascode transistors Mm 604 and Mt 606, as produced by the feedback switching network and based upon the voltage present at the battery voltage node 404 (switches swhw closed and switches swlv open). Positions of switches swm1 swm2, swb1, and swb2 and/or the set values of variable resistors R2, R3, R4, and F5 may vary for the differing battery supply voltages of 4.3V and 5.5V.

Capacitors 614 and 616 filter out high frequency components of the bias signals $V_{BIASt}$ and $V_{BIASm}$. Thus, the feedback bias voltage applied to transistors 604 and 606 are substantially DC voltage levels. When the RF power amplifier is operational (during transmit operations, calibration operations, etc.) bias voltages are applied via drivers 610 and 612 to the cascode transistors. Drivers 610 and 612 are operated via appropriate enable signals (EN) to either enable or disable the bias voltages at transistors 606 and 604, respectively. Disabling drivers 610 and 612 via appropriate levels of signal EN results in power savings operations by disabling the power amplifier.

FIG. 7 is a block diagram illustrating a differential embodiment of an RF power amplifier constructed according to one or more embodiments of the present invention. The differential RF power amplifier includes single-ended cascode amplifiers 702 and 704. Cascode amplifier 702 includes transconductance stage 706 and cascode stage 708. Cascode amplifier 704 includes transconductance stage 710 and cascode stage 712. Bias feedback circuitry 714 applies bias voltages to one or more bias voltage inputs of the cascode stages 708 and 712. Differential signal inputs are input to transconductance stages 710 and 706. Differential transconductance stage outputs are present at respective battery voltage node 704 output points.

Figure 8:
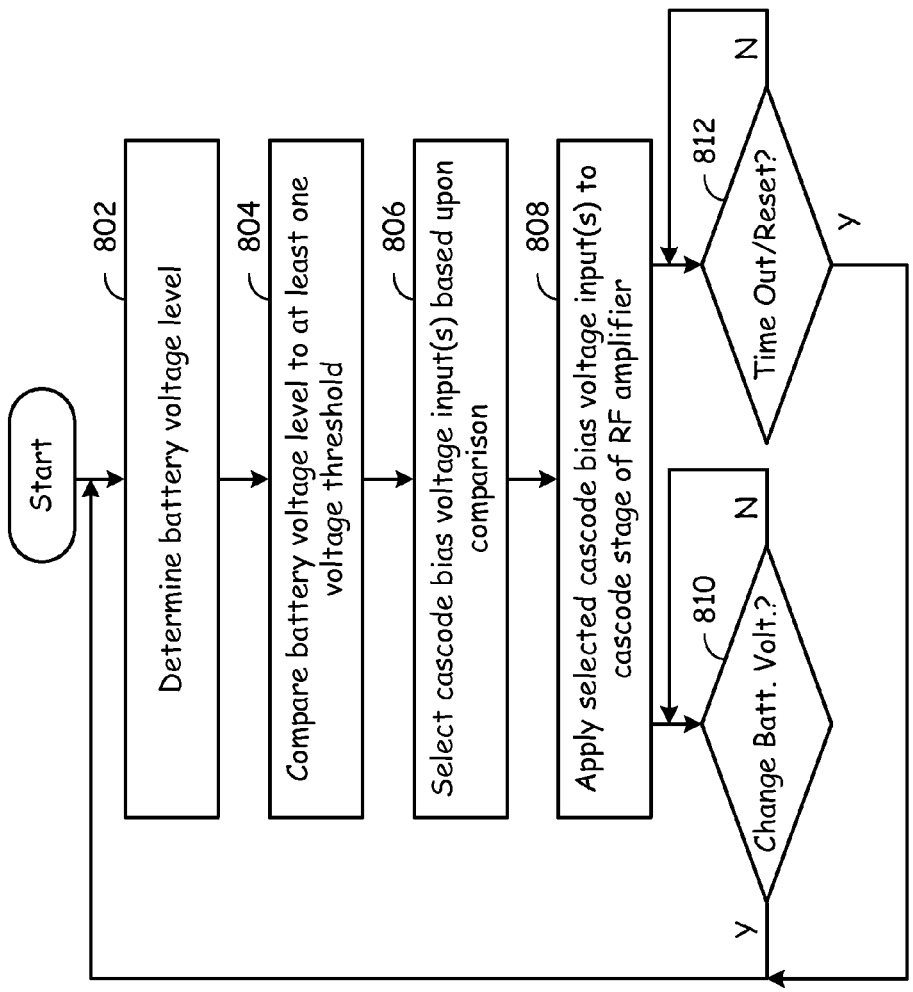
FIG. 8 is a flow chart illustrating a method for operating an RF cascode power amplifier supplied by differing battery supply voltage levels according to one or more embodiments of the present invention.

FIG. 8 is a flow chart illustrating a method for operating an RF cascode power amplifier supplied by differing battery supply voltage levels according to one or more embodiments of the present invention. The operations 800 of FIG. 8 commences with the determination of the battery voltage supply level (Step 802). With the structures previously illustrated herein with reference to FIGS. 4-7, the cascode bias feedback circuitry determines the battery voltage supply level at battery voltage node. Then, the cascode bias feedback circuitry compares the battery voltage level to at least one voltage threshold (Step 804). Because the method of the present invention supports multiple, i.e., more than two differing battery voltage levels, in some embodiments, at least two thresholds are required for comparison purposes. Then, based on the comparison of Step 804, the cascode bias feedback circuitry selects cascode bias voltage input(s) (Step 806). When a relatively lower battery voltage is determined, the result at Step 806 may be to select a fixed bias voltage for application to the cascode transistors of the cascode RF power amplifier. However, when the determination of Step 806 reveals that at the battery voltage node is at a relatively higher level, the cascode feedback bias circuitry decides to apply a feedback bias voltage or voltages to the cascode transistors of the cascode RF power amplifier.

Then, the cascode stage applies one or more selected cascode bias voltage inputs to the cascode stage of the RF power amplifier (Step 808). These operations continue until the device determines that differing bias voltage(s) may be required. For example, referring again to FIG. 6, if the RF power amplifier is not needed for immediate transmission or amplification of transmitted signals, the cascode transistors of the cascode stage may be disabled so that power consumption is reduced. Further, if the device enters into a time-out situation, as determined at Step 812, return to Step 804 may be had. Further, if the device is reset, operation would also return to Step 802.

In another embodiment, the cascode bias feedback circuitry monitors continually or periodically the battery supply voltage level at the battery voltage node. In such case, the cascode bias feedback circuitry may detect a change in battery voltage at Step 810. In such case, if the battery voltage changes, operation proceeds again to Step 802.

The terms "circuit" and "circuitry" as used herein may refer to an independent circuit or to a portion of a multifunctional circuit that performs multiple underlying functions. For example, depending on the embodiment, processing circuitry may be implemented as a single chip processor or as a plurality of processing chips. Likewise, a first circuit and a second circuit may be combined in one embodiment into a single circuit or, in another embodiment, operate independently perhaps in separate chips. The term "chip," as used herein, refers to an integrated circuit. Circuits and circuitry may comprise general or specific purpose hardware, or may comprise such hardware and associated software such as firmware or object code.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to." As may even further be used herein, the term "operable to" indicates that an item includes one or more of power connections, input(s), output (s), etc., to perform one or more its corresponding functions and may further include inferred coupling to one or more other items. As may still further be used herein, the term "associated with," includes direct and/or indirect coupling of separate items and/or one item being embedded within another item. As may be used herein, the term "compares favorably," indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A Radio Frequency (RF) power amplifier operable with differing battery supply voltages, the RF power amplifier comprising:
   a transconductance stage having a transistor with an RF signal input at its gate;
   a cascode stage having at least two cascode transistors, the cascode stage coupled in series with the transconductance stage between a battery voltage node and ground, the cascode stage having an RF signal output and at least two bias inputs to the at least two cascode transistors; and
   cascode bias feedback circuitry operable to:
      apply fixed bias voltages to the at least one two bias inputs for a low battery voltage; and
      apply feedback bias voltages to the at least two bias inputs for a high battery voltage, the feedback bias voltages based upon a voltage of the battery voltage node.

2. The RF power amplifier of claim 1, the cascode bias feedback circuitry operable to select one of the fixed bias voltages or the feedback bias voltages based upon a DC voltage of the battery voltage node.

3. The RF power amplifier of claim 1, the cascode bias feedback circuitry comprising:
   a switched network coupled between the battery voltage node and ground, having a plurality of lumped circuit elements and a plurality of switches, and operable to produce the feedback bias voltages;
   a fixed bias voltage source operable to produce the fixed bias voltages;
   at least one switch operable to apply one of the fixed bias voltages and the feedback bias voltages to the at least one bias input.

4. The RF power amplifier of claim 3, wherein at least some of the plurality of lumped circuit elements of the switched network comprise variable resistors.

5. The RF power amplifier of claim 3, further comprising at least one driver coupling the output of the at least one switch to the at least two bias inputs, the at least one driver controllable to couple to the at least two cascode transistors either:
   a respective bias input; or
   a disabling voltage.

6. The RF power amplifier of claim 1, wherein the differing supply voltages comprise at least two differing battery supply voltages.

7. The RF power amplifier of claim 1, wherein the differing supply voltages comprise at least four differing battery supply voltages.

8. A Radio Frequency (RF) power amplifier operable with differing battery supply voltages, the RF power amplifier comprising:
   a transconductance stage having a transconductance device with an RF signal input;
   a cascode stage having at least one cascode transistor, the cascode stage coupled in series with the transconductance stage between a battery voltage node and ground, the cascode stage having an RF signal output and at least one bias input to the at least one cascode transistor; and
   cascode bias feedback circuitry operable to:
      apply fixed bias voltage(s) to the at least one bias input for a low battery voltage; and
      apply feedback bias voltage(s) to the at least one bias input for a high battery voltage, the feedback bias voltage(s) based upon a voltage of the battery voltage node.

9. The RF power amplifier of claim 8, the cascode bias feedback circuitry operable to select one of the fixed bias voltage(s) or the feedback bias voltage(s) based upon a DC voltage of the battery voltage node.

10. The RF power amplifier of claim 8, the cascode bias feedback circuitry comprising:
   a switched network coupled between the battery voltage node and ground, having a plurality of lumped circuit elements and a plurality of switches, and operable to produce the feedback bias voltage(s);
   a fixed bias voltage source operable to produce the fixed bias voltage(s);

at least one switch operable to apply one of the fixed bias voltage(s) and the feedback bias voltage(s) to the at least one bias input.

11. The RF power amplifier of claim 10, wherein at least some of the plurality of lumped circuit elements of the switched network comprise variable resistors.

12. The RF power amplifier of claim 10, further comprising at least one driver coupling the output of the at least one switch to the at least one bias input, the at least one driver controllable to couple to the at least one cascode transistor either:
the at least one bias input; or
a disabling voltage.

13. The RF power amplifier of claim 10, wherein:
the transconductance stage comprises a first transistor;
the cascode transistor comprises second and third transistors; and
a source and a drain of the first transistor, a source, and a drain of the second transistor, and a source and a drain of the third transistor couple in series between the battery voltage node and ground.

14. The RF power amplifier of claim 10, wherein the differing supply voltages comprise at least two differing voltage levels.

15. The RF power amplifier of claim 10, wherein the differing supply voltages comprise at least four differing voltage levels.

16. A method for operating of a Radio Frequency (RF) cascode power amplifier supplied by differing battery supply voltage levels comprising:
determining a battery supply voltage;
comparing the battery supply voltage to at least one voltage threshold;
for a first comparison result to indicate a relatively lower battery voltage, applying fixed bias voltage(s) to at least one bias input of a cascode stage of the RF cascode power amplifier; and
for a second comparison result to indicate a relatively higher battery voltage, applying feedback bias voltage(s) to the at least one bias input of the RF cascode power amplifier, wherein the feedback bias voltage(s) is based upon an output voltage of the RF cascode power amplifier.

17. The method of claim 16, further comprising selecting one of the fixed bias voltage(s) or the feedback bias voltage(s) based upon a DC battery supply voltage.

18. The method of claim 16, wherein the differing battery supply voltages comprise at least two differing voltage levels.

19. The method of claim 16, wherein the differing battery supply voltages comprise at least four differing voltage levels.

* * * * *

UNITED STATES PATENT AND TRADEMARK OFFICE
CERTIFICATE OF CORRECTION

PATENT NO.        : 7,786,807 B1
APPLICATION NO.   : 12/428616
DATED             : August 31, 2010
INVENTOR(S)       : Mingyuan Li et al.

Page 1 of 1

It is certified that error appears in the above-identified patent and that said Letters Patent is hereby corrected as shown below:

Col. 12, line 2, in claim 1, after "the at least", delete "one"

Signed and Sealed this
Third Day of April, 2012

David J. Kappos
*Director of the United States Patent and Trademark Office*